(12) United States Patent
Lu et al.

(10) Patent No.: US 7,939,370 B1
(45) Date of Patent: May 10, 2011

(54) POWER SEMICONDUCTOR PACKAGE

(75) Inventors: Jun Lu, San Jose, CA (US); François Hébert, San Mateo, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 7 days.

(21) Appl. No.: 12/608,853

(22) Filed: Oct. 29, 2009

(51) Int. Cl.
*H01L 21/00* (2006.01)

(52) U.S. Cl. ....................................... 438/107; 257/724

(58) Field of Classification Search .................. 438/107, 438/108, 110, 111, 121; 257/669, 778, 676, 257/723, 724, 691
See application file for complete search history.

(56) References Cited

U.S. PATENT DOCUMENTS

| | | | |
|---|---|---|---|
| 5,391,919 A * | 2/1995 | Torti et al. ..................... 257/692 |
| 6,184,570 B1 * | 2/2001 | MacDonald et al. ......... 257/622 |
| 6,624,522 B2 | 9/2003 | Standing et al. |
| 6,765,292 B2 * | 7/2004 | Cheah et al. .................. 257/734 |
| D503,691 S | 4/2005 | Standing et al. |
| 6,893,901 B2 | 5/2005 | Madrid |
| 7,285,866 B2 | 10/2007 | Standing et al. |
| 2007/0091546 A1 | 4/2007 | Standing et al. |
| 2007/0194441 A1 | 8/2007 | Pavier |
| 2007/0202631 A1 | 8/2007 | Standing |
| 2007/0284722 A1 | 12/2007 | Standing |
| 2008/0066303 A1 | 3/2008 | Standing |
| 2009/0250798 A1 * | 10/2009 | Bathan et al. ................. 257/676 |
| 2010/0096735 A1 * | 4/2010 | Shen et al. .................... 257/676 |

* cited by examiner

*Primary Examiner* — S. V Clark
(74) *Attorney, Agent, or Firm* — Kenneth C. Brooks

(57) ABSTRACT

The present invention features a power semiconductor package and a method of forming the same that includes forming, in the body, a stress relief region disposed between a pair of mounting regions and attaching a semiconductor die in each of the mounting regions. The semiconductor die has first and second sets of electrical contacts with the first set being on a first surface of the semiconductor die and the second set being disposed upon a second surface of the semiconductor die opposite to the first surface. The first set is in electrical communication with the mounting region. Walls are formed on outer sides of the pair of mounting regions, defining a shaped body, with the shaped body and walls defining an electrically conductive path that extends from the first set and terminates on side of the package common with the second set.

27 Claims, 12 Drawing Sheets

POWER SEMICONDUCTOR PACKAGE

BACKGROUND OF THE INVENTION

The present invention generally relates to semiconductor packages and more particularly to power semiconductor packages and methods of making power semiconductor packages.

Optimizing the operational performance of power semiconductor packages requires satisfaction of several constraints. The constraints include acceptable power density, parasitics, reliability and cost of manufacture. Power density is related to heat dissipation of the package. As a result, obtaining desired power density often requires efficient cooling of the package. One manner in which to achieve cooling of the package is by exposing thermally conductive features, such as metal and silicon, of the active components of the package to an ambient environment. It is typically desired to configure the package to provide mechanical protection to the silicon features.

Elimination of wire bonds facilitates obtaining acceptable parasitics (e.g., parasitic resistance and inductance). To that end, interconnection of the active components is often facilitated by clip bonding, chip-only ball grid array with solder balls/bumps. The drawback of clip bonding is that the top exposure area is limited and a traditional mold process is required for package integrity. The drawback of chip-only ball grid array is that the connection to certain active components, such as the drain of a bottom-drain vertical MOSFET, is problematic. The mechanical integrity of the ball grid array may become compromised when operating at the upper power limits of the package. In addition, the semiconductor chip may be exposed to physical damage in such a configuration. The process of mounting a semiconductor chip, or a package with multiple chips may also experience stresses from the different coefficients of thermal expansion.

Cost of manufacture may be controlled by minimizing the amount of materials employed to fabricate the same. This may be achieved by obtaining, as close as possible, the ratio of the size of the package to the size of the active element to be 1:1. Also, the miniaturization of parts is an ongoing goal in the field of electronics. Reducing the complexity of the process by which to fabricate the package may also reduce cost.

Reliability may be provided by ensuring the mechanical strength of the package. To that end, it would be desired to provide physical protection to the semiconductor silicon of the active elements, while improving the robustness of the package.

A need exists, therefore, to provide power semiconductor packages having desired operational characteristics.

SUMMARY OF THE INVENTION

The present invention features a power semiconductor package and a method of forming the same that includes forming, in the body, a stress relief region disposed between a pair of mounting regions and attaching a semiconductor die in each of the mounting regions. The semiconductor die has first and second sets of electrical contacts with the first set being disposed on a first surface of the semiconductor die and the second set being disposed upon a second surface of the semiconductor die opposite to the first surface. The first set is in electrical communication with the mounting region. Walls are formed on outer sides of the pair of mounting regions, defining a shaped body, with the shaped body and walls defining an electrically conductive path that extends from the first set and terminates on a side of the package common with the second set. The stress relief region is configured to create differential rigidity between the stress relief region and the remaining portions of the body such that the remaining portions have a greater stiffness associated therewith than the stress relief region. To that end, the stress relief region may be formed from a plurality of apertures in the stamped body, or a bend in the stamped body that extends along the entire length thereof or a combination thereof. Typically, one or more semiconductor dies are fixedly attached to the mounting regions. Optionally, an additional semiconductor chip, e.g., a controller integrated circuit (IC) chip, my be stacked on the one or more semiconductor dies. To provide mechanical protection to the semiconductor dies, the stamped body includes opposed walls, with each of the pair of mounting regions extending from the wall and terminating proximate to the stress relief region. These and other aspects of the invention are discussed more fully below.

DETAILED DESCRIPTION OF THE INVENTION

Figure 1:
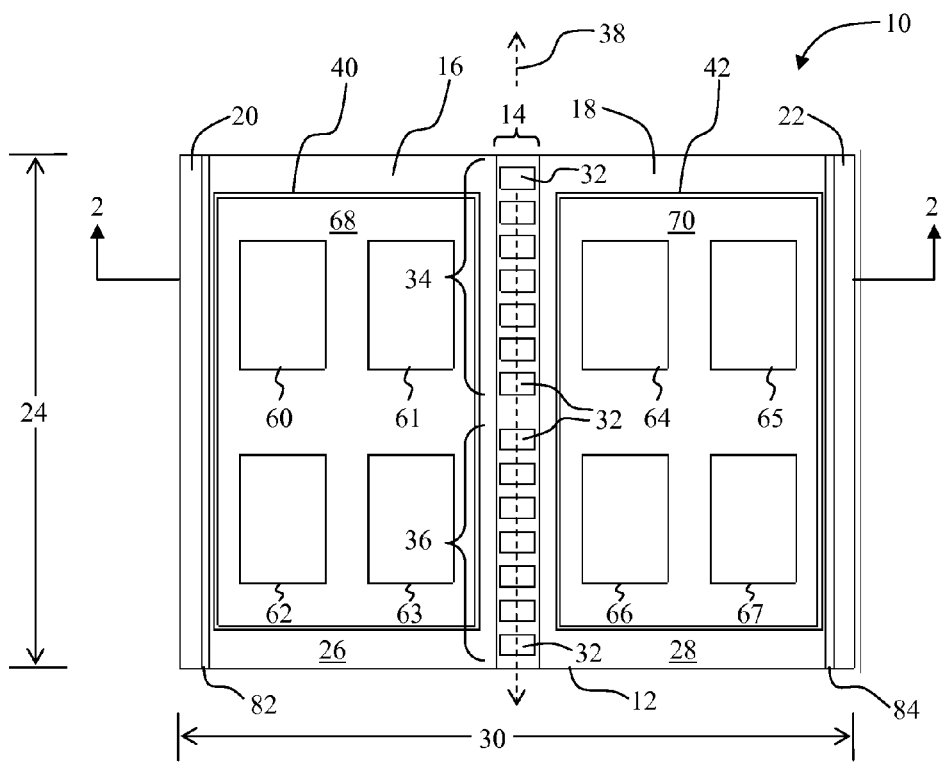
FIG. 1 is a plan view of a semiconductor power package in accordance with one embodiment of the present invention.

Referring to FIG. 1, a semiconductor power package 10 that includes a body 12 having a stress relief region 14 disposed between a pair of mounting regions 16 and 18 and opposed walls 20 and 22. Stress relief region 14, mounting regions 16 and 18, and walls 20 and 22 are co-extensive with a length 24 of package 10. Mounting region 16 includes a mounting surface 26, and mounting region 18 includes mounting surface 28. Mounting region 16 extends parallel to a width 30 of package 10 from wall 20 toward mounting region 18, terminating proximate to stress relief region 14. Mounting region 18 extends parallel to width 30 of package 10 from wall 22 toward mounting region 16, terminating proximate to stress relief region 14. Stress relief region 14 is centrally disposed along width 30 and includes a plurality of spaced-apart apertures 32 formed into body 12. As shown, apertures 32 are configured in two groups 34 and 36, with apertures 32 of each group being equally spaced along length 24. Spacing between groups 34 and 36 is greater than the spacing between apertures 32 within groups 34 and 36. The presence of apertures 32 provides stress relief region 14 with a stiffness that is less than the stiffness of the remaining portions of body 12. In this manner, package 10 is configured to flex about an axis 38 that extends parallel to length 24 to compensate for stresses that occur in response to temperature cycling of package 10.

Figure 2:
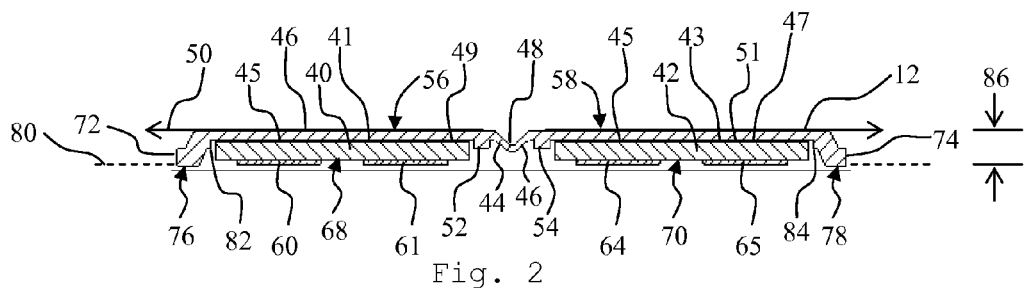
FIG. 2 is a cross-sectional view of the semiconductor power package shown in FIG. 1 taken along lines 2-2.

Referring to both FIGS. 1 and 2, typically, one or more semiconductor dies, shown as 40 and 42, are fixedly attached to mounting surfaces 26 and 28. Semiconductor dies 40 and 42 may be mounted using any known technique, such as epoxy, eutectic die bonding, solder, die attach film or other adhesives, shown as layers 43 and 47. Surfaces 41 and 43 of semiconductor dies 40 and 42, respectively, may contain contacts 49 and 51 that may be electrically connected to the body 12. To facilitate flexing of stress relief region 14, the entire area of each semiconductor die 40 and 42 is disposed between stress relief region 14 and one of walls 20 and 22. As shown, semiconductor die 40 is disposed in mounting region 16 so as to lie between stress relief region 14 and wall 20. Semiconductor die 42 is disposed in mounting region 18 so as to lie between stress relief region 14 and wall 22. Additional flexibility is provided to stress relief region 14 by forming a bend in the same. As shown, stress relief region 14 includes two opposing sides 44 and 46 that extend from an arcuate juncture 48 toward one of mounting regions 16 and 18, forming an oblique angle with respect to a common plane 50. Specifically, side 44 extends from juncture 48 and terminates in a shoulder 52, and side 46 extends from junction 48 and terminates in shoulder 54. Shoulders 52 and 54 are coextensive with length 24. Plane 50 extends substantially parallel to mounting surfaces 26 and 28. Disposed opposite to mounting surface 26 is a first opposing surface 56 of body 12 and a second opposing surface 58 of body 12, is disposed opposite to mounting surface 28. First and second opposing surfaces 56 and 58 lie in plane 50.

Mechanical protection is provided to semiconductor dies 40 and 42 by fabricating body 12 from a mechanically robust material, compared to the semiconductor material from which semiconductor dies 40 and 42 are fabricated. For example, body 12 may be formed from metal and provided with a sufficient thickness to resist damage. Semiconductor dies 40 and 42 often include metallic contacts 60-67. Contacts 60-63 are mounted to die surface 68 of semiconductor die 40, and contacts 64-67 are mounted to die surface 70 of semiconductor die 42. Additionally, walls 20 and 22 are dimensioned to form a protective cavity, within package 10, for semiconductor dies 40 and 42. To that end, wall 20 extends from mounting surface 16 ending in a lead region 72, and wall 22 extends from surface 18 ending in a lead region 74. Lead region 72 and lead region 74 each have a surface 76 and 78, respectively, that lie in a common plane 80. Additional mechanical strength is provided to wall 20 by the presence of a bulwark disposed at a terminus thereof opposite to lead region 72, which defines a shoulder 82. Similarly, wall 22 includes a bulwark that defines shoulder 84. These shoulders may be formed by a half-etch process of the body 12. To control a thickness 86 of package 10, the bend in stress relief region 14 is established to form juncture 48 that is spaced-apart from both planes 50 and 80.

Figure 3:
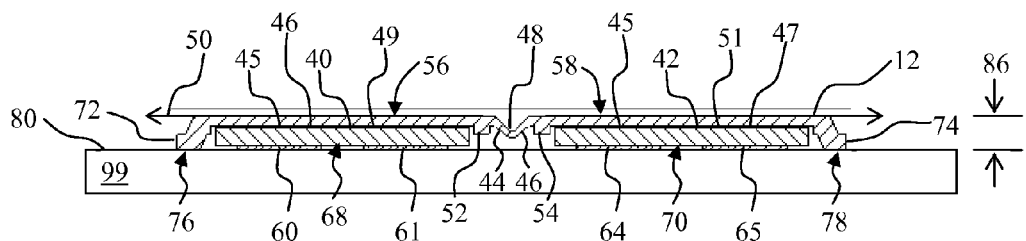
FIG. 3 is a cross-sectional view of the semiconductor power package shown in FIG. 2, mounted on a printed circuit board (PCB)

Package 10 may be mounted onto a surface such as a printed circuit board (PCB) 99 which lies in plane 80, as shown in FIG. 3. Electrical coupling of contacts 49, 51 and 60-67 in a common plane, such as a surface of PCB 99, may be achieved by forming body 12 from an electrically conductive material. To that end, die surfaces 68 and 70 are disposed proximate to plane 80, so that contacts 60-67, and lead regions 72 and 74 may be mounted onto a surface of PCB 99. Lead regions 72 and 74 are coplanar to contacts 60-67. Thus, lead regions 72 and 74 allow contacts 49 and 51 to facilitate electrical coupling of contacts 49 and 51 to a surface positioned on a common side of semiconductor dies 40 and 42 with contacts 60-67. Contacts 49 and 51, as well as contacts 60-67, may be in electrical communication with PCB 99 using any known means, e.g., solder, conductive epoxy and the like. Package 10 may be mounted to PCB 99 using, e.g., solder. As can be seen, the outline of package 10 is not much larger than the outline of semiconductor dies 40 and 42, while allowing contact to be made from sides of semiconductor dies 40 and 42 opposite to sides 68 and 70 through the body 12 and lead regions 72 and 74 to the PCB 99. By way of example, the dies 40, 42 may comprise a high side field effect transistor (FET) and a low side FET.

Figure 4:
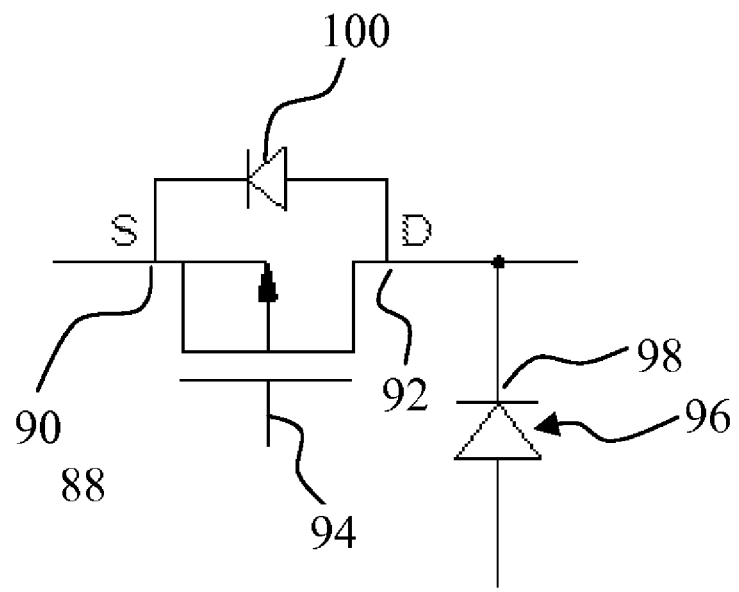
FIG. 4 is an electronics schematic showing an electrical configuration of the semiconductors dies shown in FIGS. 1 and 2, above, in accordance with the present invention.
Figure 5:
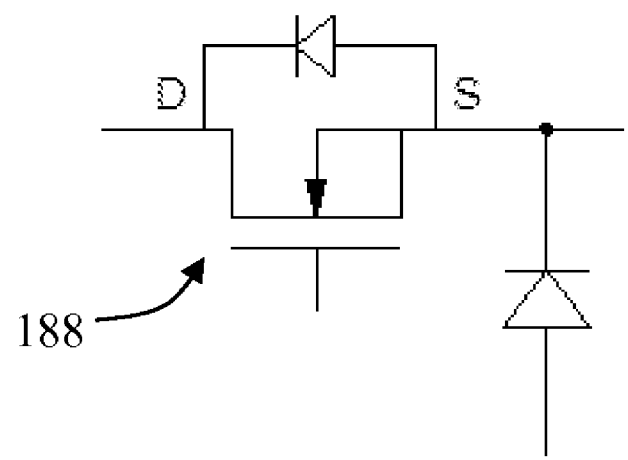
FIG. 5 is an electronics schematic showing an electrical configuration of the semiconductors dies shown in FIGS. 1 and 2, above, in accordance with a first alternate embodiment of the present invention.

Referring to FIGS. 1, 2 and 4, semiconductor die 40 may comprise circuits that may include a power p-channel MOSFET 88 having a source 90, a drain 92 and a gate 94, with an internal body diode 100. Semiconductor die 42 may include a diode 96 that has a cathode 98 connected to drain 92. In this case drain 92 contact of MOSFET 88 is located on side 41 of semiconductor die 40, and cathode 98 contact of diode 96 is located on side 43 of semiconductor die 42. Sides 41 and 42 are electrically connected together through body 12 of package 10. Alternatively, p-channel MOSFET 88 may be replaced with an N-channel MOSFET 188, as shown in FIG. 5.

Figure 6:
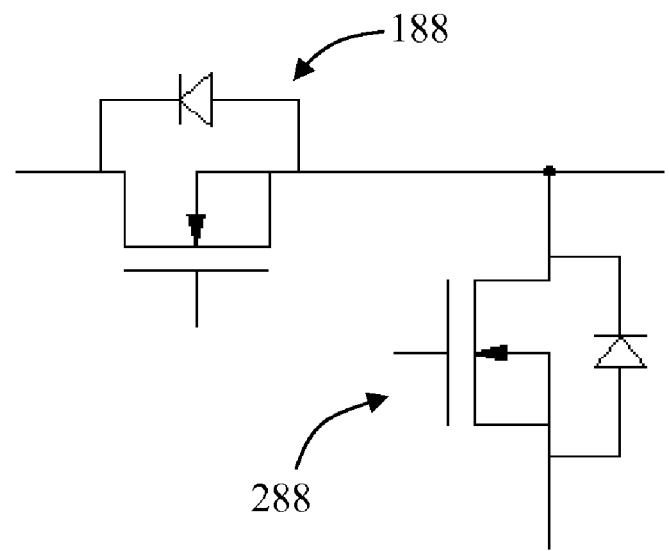
FIG. 6 is an electronics schematic showing an electrical configuration of the semiconductors dies shown in FIGS. 1 and 2, above, in accordance with a second alternate embodiment of the present invention.
Figure 7:
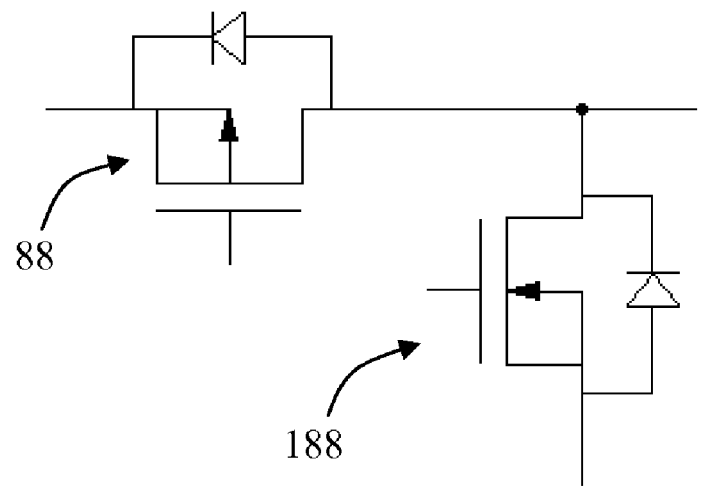
FIG. 7 is an electronics schematic showing an electrical configuration of the semiconductors dies shown in FIGS. 1 and 2, above, in accordance with a third alternate embodiment of the present invention.

Referring to both FIGS. 1 and 6, semiconductor dies 40 and 42 may comprise two N-channel MOSFETS 188 and 288 (the source of MOSFET 188 may be connected to the drain of MOSFET 288), or the configuration shown in FIG. 7 with P-channel MOSFET 88 being connected with N-channel MOSFET 188.

Figure 8:
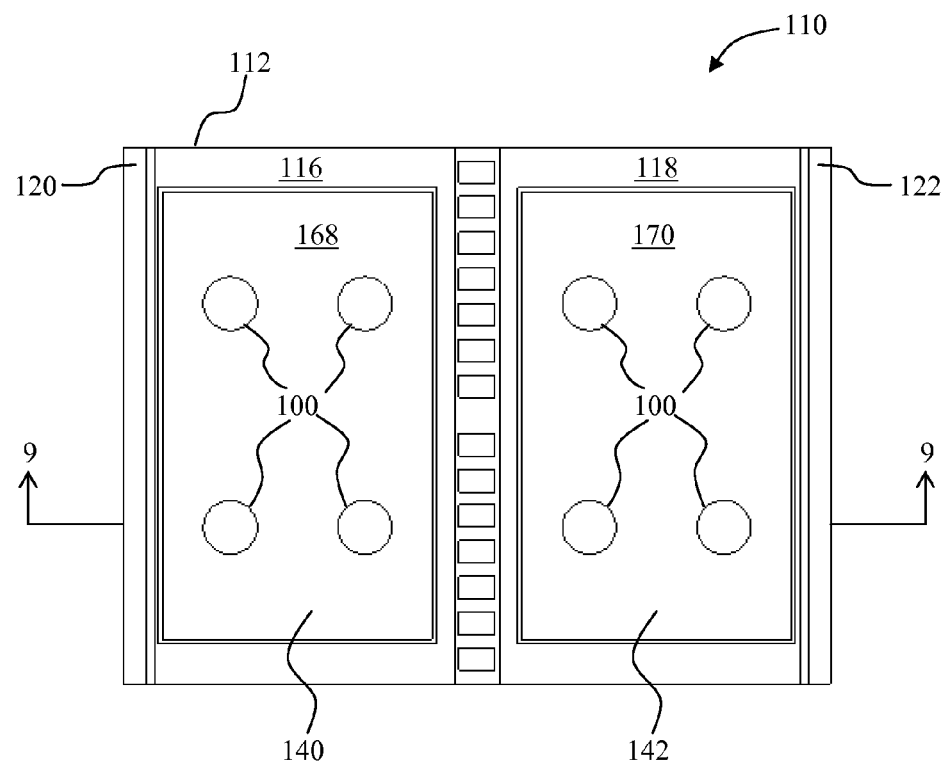
FIG. 8 is a plan view of a semiconductor power package in accordance with a fourth alternate embodiment of the present invention.
Figure 9:
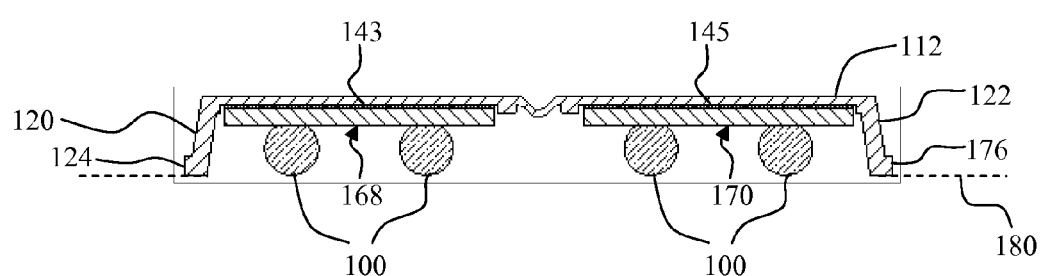
FIG. 9 is a cross-sectional view of the semiconductor power package shown in FIG. 8 taken along lines 9-9.
Figure 10:
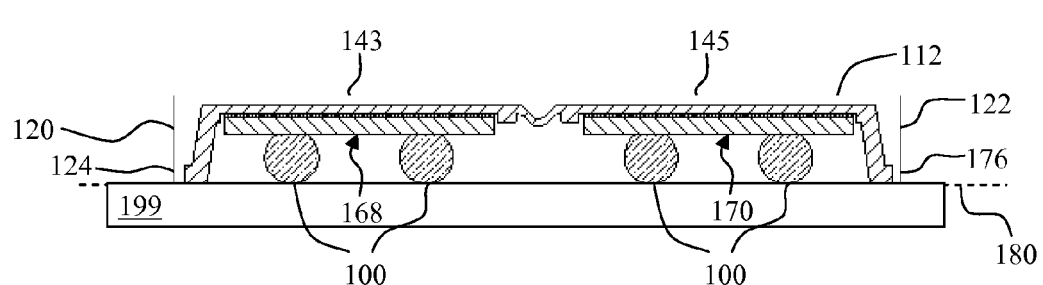
FIG. 10 is a cross-sectional view of the semiconductor power package shown in FIG. 9, mounted on a printed circuit board (PCB)

Body 12 in FIG. 1 may be re-configured as body 112 in FIGS. 8 and 9 to operate with a power semiconductor package employing solder ball technology. Solder balls 100 may be included to provide electrical connection to the electrodes (not shown) of semiconductor dies 140 and 142. Solder balls 100 may extend further from die surfaces 168 and 170, than metallic contacts 60-67 do from die surfaces 68 and 70, shown in FIG. 2. Referring again to FIGS. 8 and 9, body 112 includes walls 120 and 122 that extend from mounting surfaces 116 and 118, respectively, and terminate in lead regions 174 and 176. Lead regions 174 and 176 lie in a common plane 180. Walls 120 and 122 extend a sufficient distance from die surfaces 168 and 170 such that solder balls 100, taking into account factors such as reflow of the solder ball, etc., facilitates electrical coupling to a common surface, lead regions 174 and 176 and solder balls. In this example, the common surface is a planar surface of a printed circuit board 199, as shown in FIG. 10. Electrical connection can be made using solder, conductive epoxy, the solder balls 100 themselves, or other suitable materials. The distance, therefore, is dependent upon the size of solder balls 100, as well as the distance between die surfaces 168 and 170 from mounting surfaces 116 and 118 and the thickness of the epoxy layer or other adhesive employed to fixedly attached semiconductor dies 140 and 142 to body 112. In this fashion, protection is provided to power semiconductor dies 140 and 142 while allowing convenient electrical connection to a backside of the same, i.e., a side facing body 112. All other features of body 112 are identical to body 12.

Figure 11:
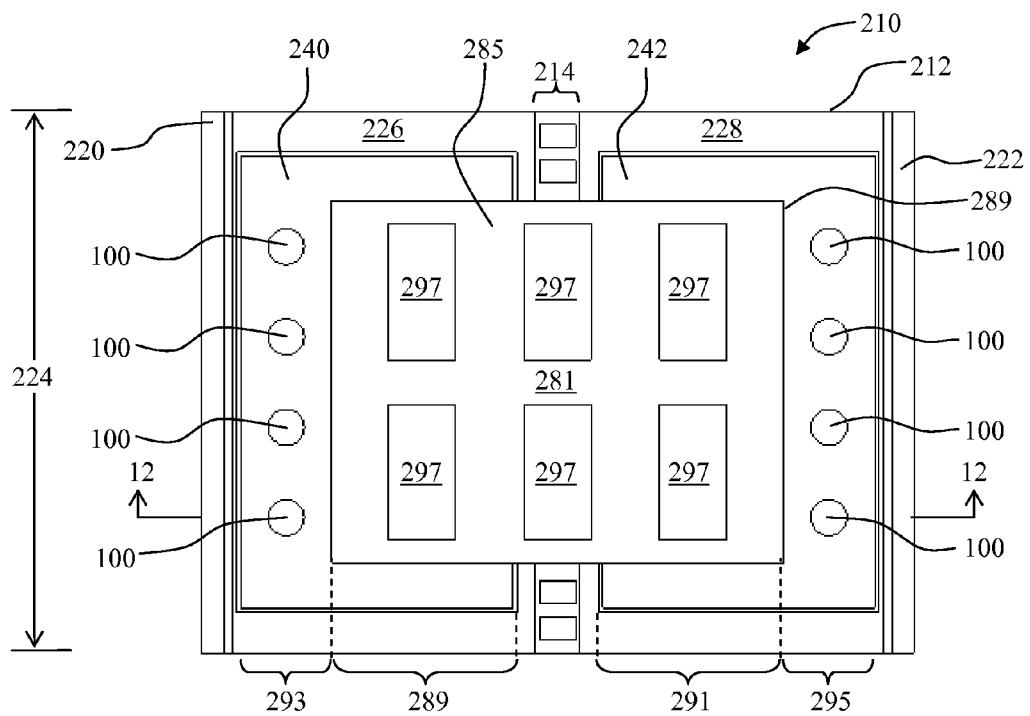
FIG. 11 is a plan view of a semiconductor power package in accordance with a fifth alternate embodiment of the present invention.
Figure 12:
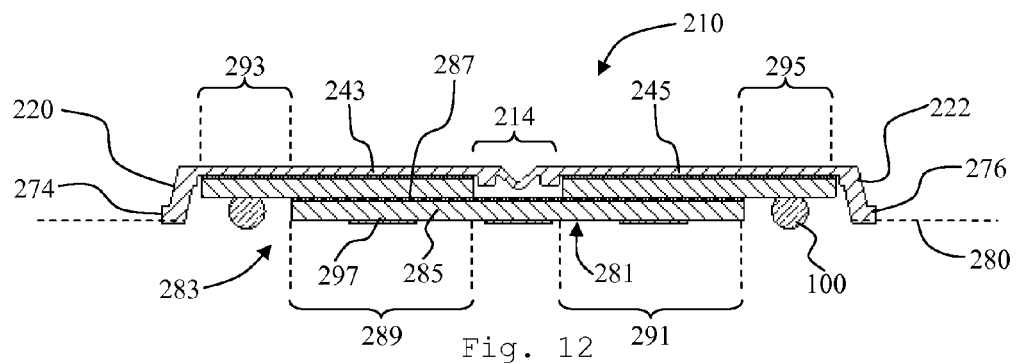
FIG. 12 is a cross-sectional view of the semiconductor power package shown in FIG. 11 taken along lines 12-12.
Figure 13:
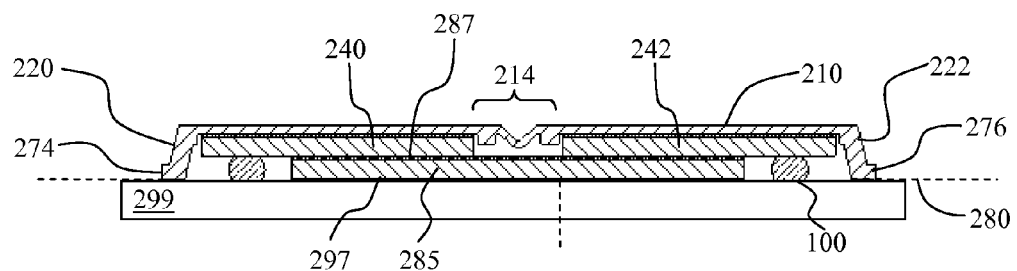
FIG. 13 is a cross-sectional view of the semiconductor power package shown in FIG. 12, mounted on a (PCB).

Referring to FIGS. 11 and 12, body 212 includes walls 220 and 222 extending a sufficient distance from mounting surfaces 226 and 228, so as to ensure that lead regions 274 and 276 lie in a common plane 280 that is coplanar with a surface 281 of a die stack 283. Die stack 283 comprises semiconductor dies 240, 242 and 285. Specifically, power semiconductor package 210 includes a pair of semiconductor dies 240 and 242 adhered to body 212 with a layer 243 and 245, respectively, of adhesive, such as, epoxy, solder and the like. An additional semiconductor die 285 is adhered to both semiconductor dies 240 and 242 with a layer 287 of adhesive, such as epoxy and the like. By way of example, adhesive 287 may be a conductive or non-conductive epoxy. In a preferred application non-conductive adhesive is used to attach semiconductor die 285 to dies 240, 242. Specifically, semiconductor die 285 forms a bridge over stress relief region 214 and is in superimposition with a portion 289 of semiconductor die 240 and portions 291 of semiconductor die 242. Solder balls 100 are coupled to regions 293 of semiconductor die 240 lying outside of portion 289, and solder balls 100 are coupled to regions 295 of semiconductor die 242 lying outside of portion 291. Projecting from die surface 281 is a plurality of metallic contacts 297. As shown, solder balls 100 of die stack 283 are placed adjacent to, but not touching, semiconductor die 285. Other than the length of walls 220 and 222, body 212 is identical to body 12. By way of example, the package 210 may be a power semiconductor module in which semiconductor dies 240 and 242 include two power field effect transistors (FETs) such as a metal oxide semiconductor FET (MOSFET). Walls 220 and 222 are dimensioned to facilitate electrical coupling of solder balls 100, contacts 297 and lead regions 274 and 276 to a common surface. Lead regions 274 and 276 are coplanar with solder balls 100. In this example, the common surface is a surface of PCP 299, shown in FIG. 3. Semiconductor die 285 includes a power control integrated circuit to control the switching of the FETs. Semiconductor die 285 may be mounted non-conductively, e.g. with non-conductive epoxy, to semiconductor dies 240 and 242. Semiconductor die 285 may be connected to gates (not shown) of the FETs externally, e.g., when mounted on a PCB 299 as shown in FIG. 13. For example, one or more of contacts 297 may be used to control a gate electrode (not shown), which may be connected to one of the solder balls 100; one or more of contacts 297 may be routed to the gate electrode corresponding to one of solder balls 100 through traces on the PCB 299. By way of example, semiconductor dies 240 and 242 may include a high side MOSFET and a low side MOSFET.

Figure 14:
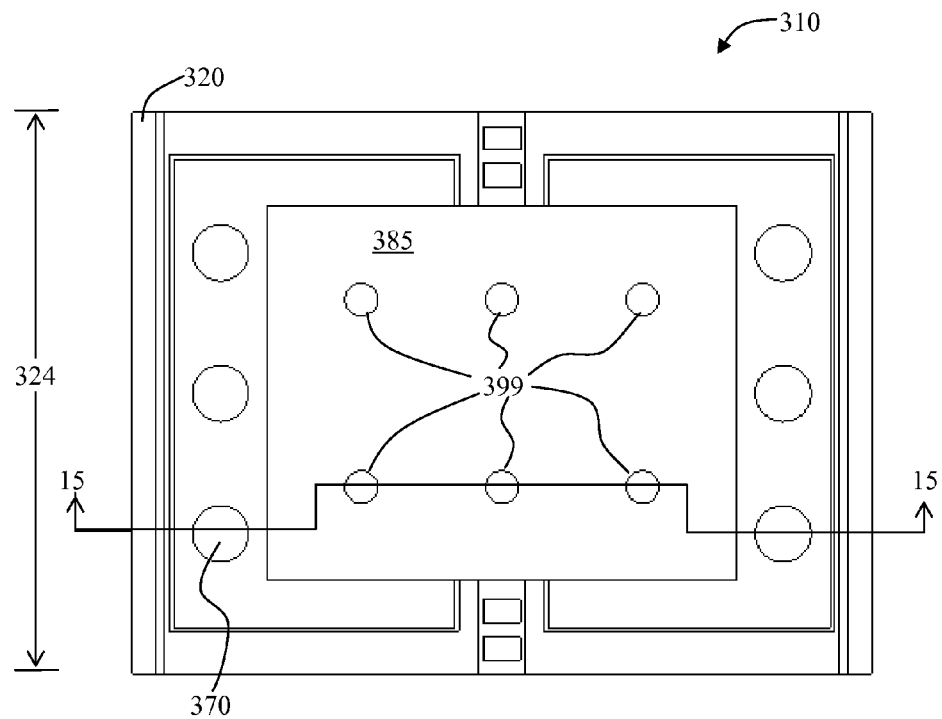
FIG. 14 is a plan view of a semiconductor power package in accordance with a sixth alternate embodiment of the present invention.
Figure 15:
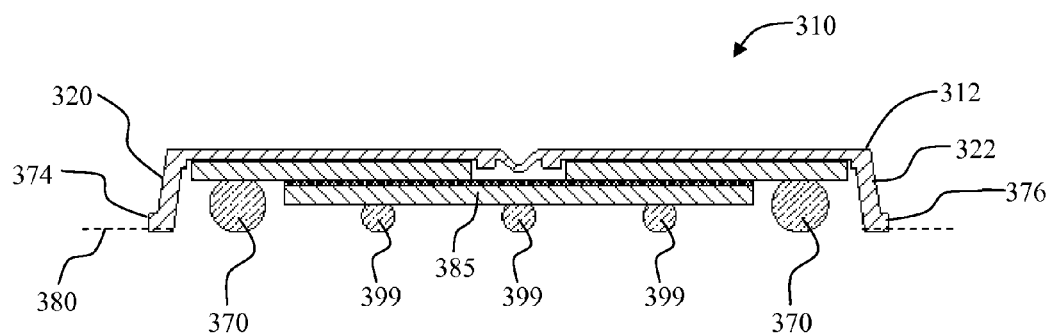
FIG. 15 is a cross-sectional view of the semiconductor power package shown in FIG. 14 taken along lines 15-15.

Referring to FIGS. 11, 14 and 15, package semiconductor power package 310 is substantially similar to semiconductor power package 210, except that metallic contacts 297 are absent from semiconductor die 385 and body 312. Instead, semiconductor die 385 includes a plurality of small solder balls 399. As a result, the distance that walls 320 and 322 extend from mounting surfaces 326 and 328, respectively, is established so that small solder balls 399 may facilitate electrical coupling to a common surface, which may be planar, with large solder balls 370 and lead portions 374 and 376.

Figure 16:
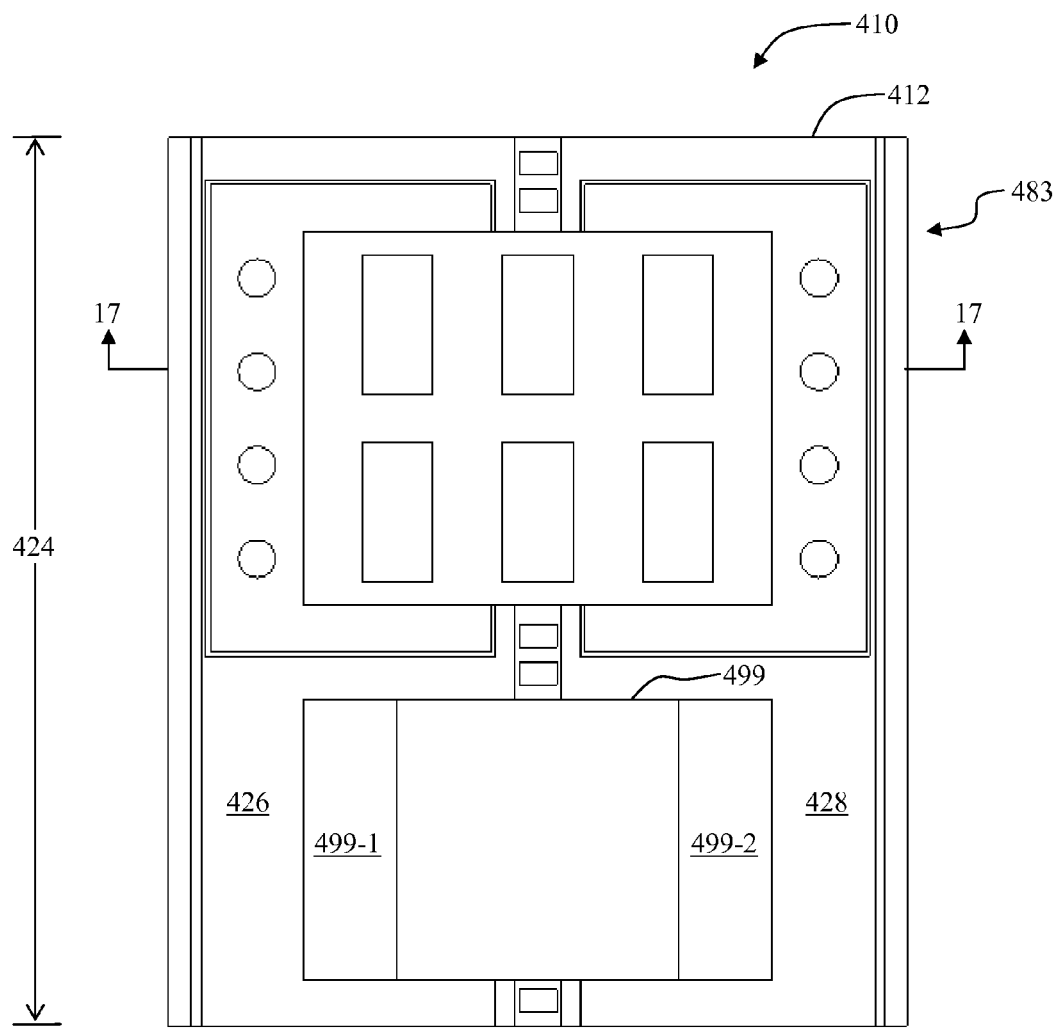
FIG. 16 is a plan view of a semiconductor power package in accordance with a seventh alternate embodiment of the present invention.
Figure 17:
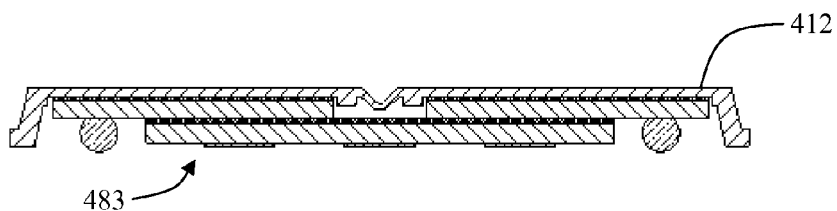
FIG. 17 is a cross-sectional view of the semiconductor power package shown in FIG. 16 taken along lines 17-17.
Figure 18:
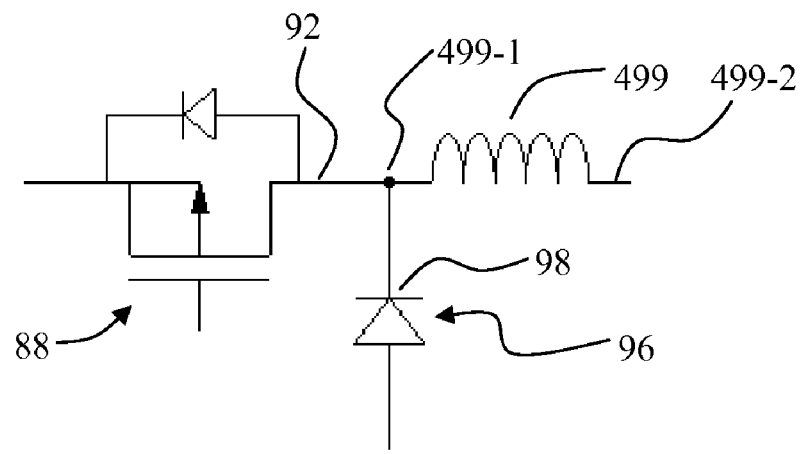
FIG. 18 is an electronics schematic showing an electrical configuration of the semiconductors dies shown in FIGS. 16 and 17, in accordance with the present invention.
Figure 19:
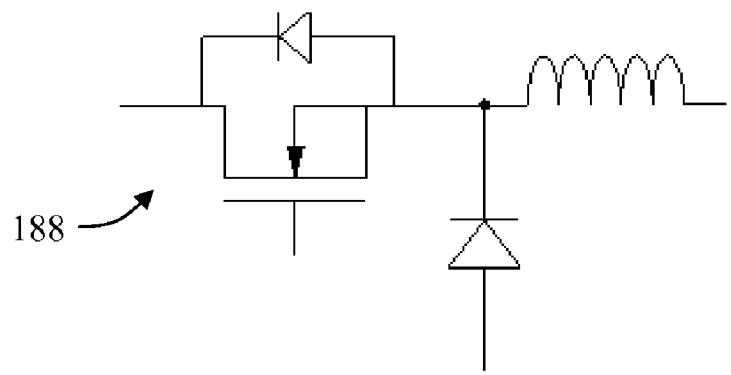
FIG. 19 is an electronics schematic showing an electrical configuration of the semiconductors dies shown in FIGS. 16 and 17, in accordance with a eighth alternate embodiment of the present invention.
Figure 20:
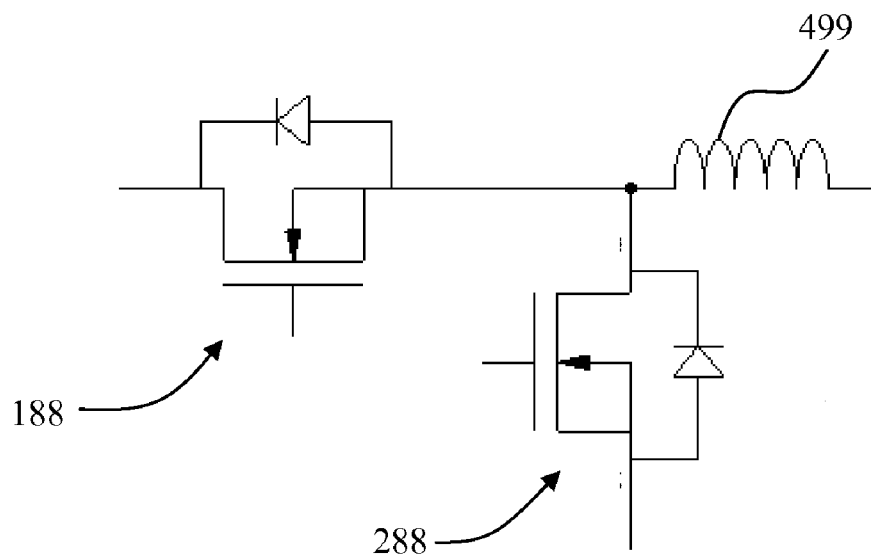
FIG. 20 is an electronics schematic showing an electrical configuration of the semiconductors dies shown in FIGS. 16 and 17, in accordance with a ninth alternate embodiment of the present invention.
Figure 21:
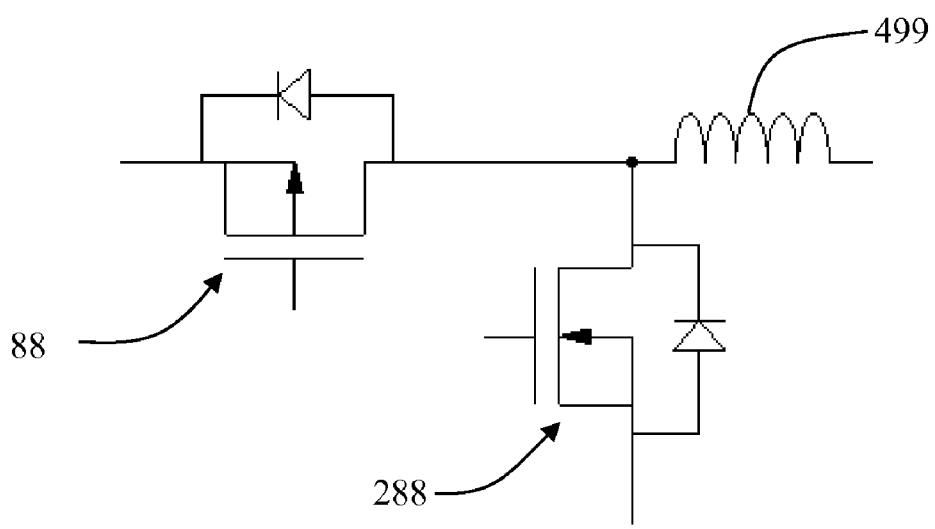
FIG. 21 is an electronics schematic showing an electrical configuration of the semiconductors dies shown in FIGS. 16 and 17, in accordance with a tenth alternate embodiment of the present invention.

Referring to FIGS. 11, 16 and 17, power semiconductor package 410 is substantially similar to power semiconductor package 210, except body 412 and the inclusion of passive element 499. Specifically, a length 424 of body 412 is longer than length 224 of body 212. This facilitates placement of passive element 499 adjacent to die stack 483. In this example, passive element 499 is an inductor that is connected between mounting surfaces 426 and 428, using any suitable means, including conductive and non-conductive epoxy, solder and the like. Package 410 may be used in certain circuits, e.g. dc-dc power converter circuits. For example, a first electrode 499-1 of inductor 499 may be connected in common with cathode 98 of diode 96 and drain 92 of P-channel MOSFET 88, shown in FIG. 18. As a further example, a first inductor electrode 499-1 may be conductively attached to the body 412 while the second inductor electrode 499-2 may be non-conductively attached to the body 412 and available for electrical connection on a mounting surface, e.g., a PCB (not shown). Alternatively, both inductor electrodes 499-1 and 499-2 may be non-conductively attached to the body 412, with both electrodes available for electrical connection through a PCB. Alternatively, P-channel MOSFET may be substituted with N-channel MOSFET 188, shown in FIG. 19. Another embodiment of package 410, shown in FIG. 16, may include inductor 499 connected in common with source/drain of two N-channel MOSFETS 188 and 288, shown in FIG. 20. N-channel FET 188 may be substituted with P-channel FET 88, shown in FIG. 21. An IC chip is not shown in these circuit schematics, but can be used to control the gate of the MOSFETs. Although an inductor is shown, other passive elements may be included therewith or in lieu thereof, such as capacitors, resistors and the like for other applications and circuits.

Figure 22:
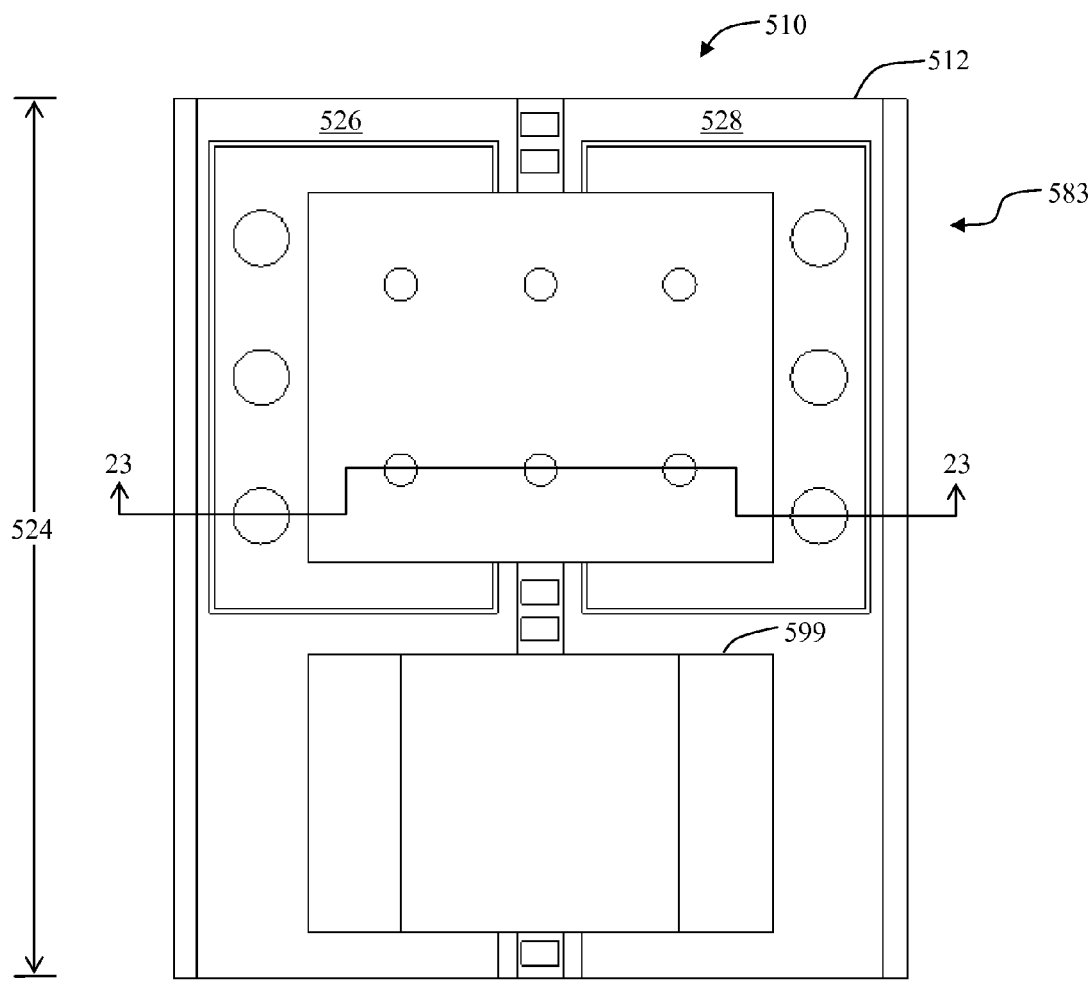
FIG. 22 is a plan view of a semiconductor power package in accordance with a eleventh alternate embodiment of the present invention.
Figure 23:
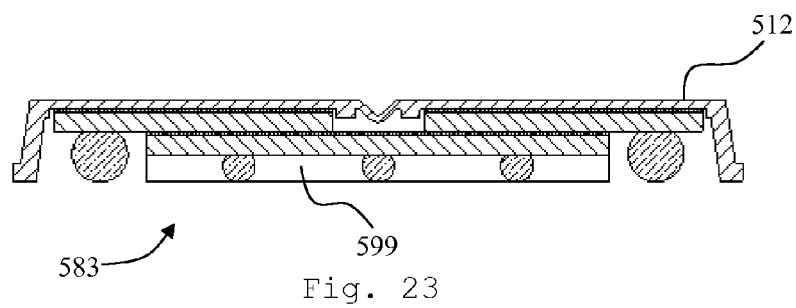
FIG. 23 is a cross-sectional view of the semiconductor power package shown in FIG. 22 taken along lines 23-23.

Referring to FIGS. 14, 22 and 23, power semiconductor package 510 is substantially similar to power semiconductor package 310, excepting body 512 and the inclusion of passive element 599. Specifically, a length 524 of body 512 is longer than length 324 of body 312. This facilitates placement of passive element 599 adjacent to die stack 583. In this example, passive element 599 is an inductor that is connected on mounting surfaces 526 and 528, using any suitable means, including conductive and non-conductive epoxy, solder and the like. Package 510 may be used in dc-dc power conversion circuits, as discussed above with respect to FIGS. 18, 19, 20 and 21.

Figure 24:
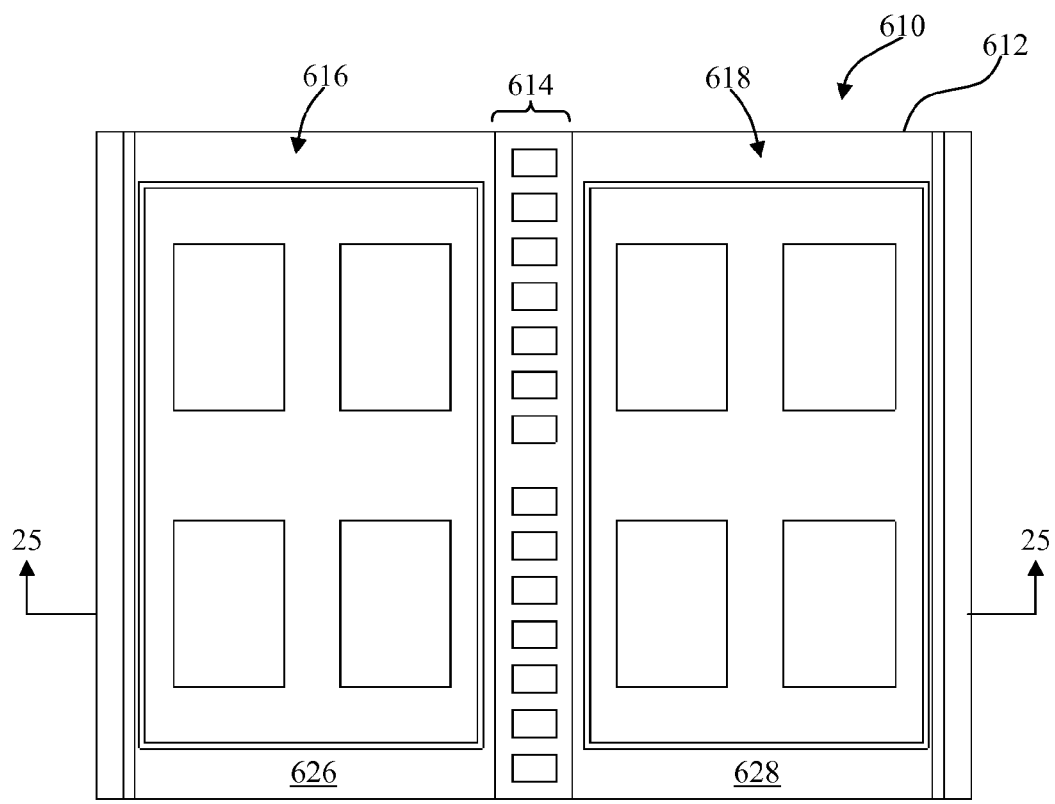
FIG. 24 is a plan view of a semiconductor power package in accordance with a twelfth alternate embodiment of the present invention.
Figure 25:
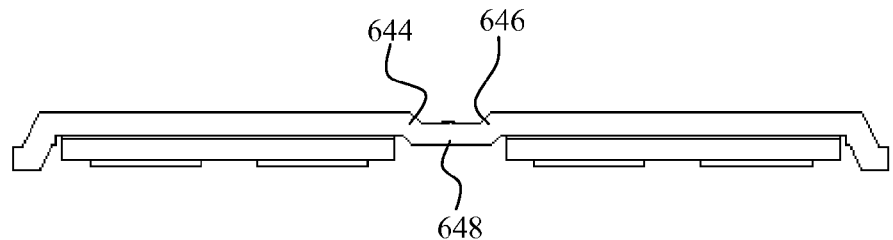
FIG. 25 is a cross-sectional view of the semiconductor power package shown in FIG. 24 taken along lines 25-25.
Figure 26:
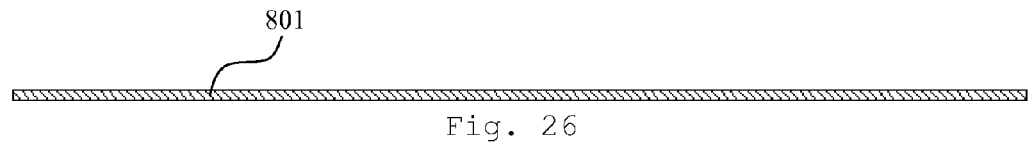
FIG. 26 is a cross-sectional view of a body used to form one of the semiconductor power packages shown in FIGS. 1, 8, 11, 14, 16 and 22, after being patterned employing an etch process.

Referring to FIGS. 1, 24 and 25, power semiconductor package 610 is substantially similar to power semiconductor package 10, excepting body 612. Specifically, stress relief region 614 includes a planar juncture 648 from which oblique sides 644 and 646 extend terminating in mounting regions 616 and 618, respectively forming a smooth transition with mounting surfaces 626 and 628, i.e., shoulders are absent. All other features of body 612 are substantially similar to body 12. The body 612 may be formed without a half etch process, and may be simply stamped into shape from a flat plate of metal.

Figure 27:
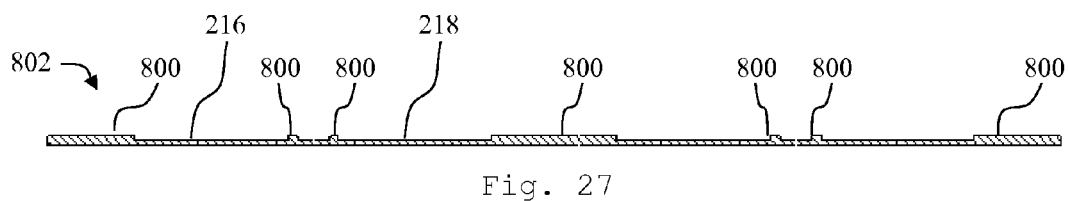
FIG. 27 is a cross-sectional view of the body shown in FIG. 26 after being patterned employing an etch process.
Figure 28:
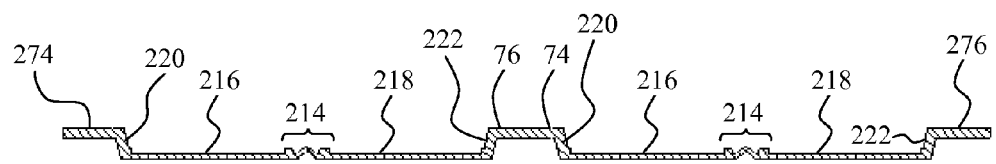
FIG. 28 is a cross-sectional view of the body shown in FIG. 27 after being stamped.
Figure 29:
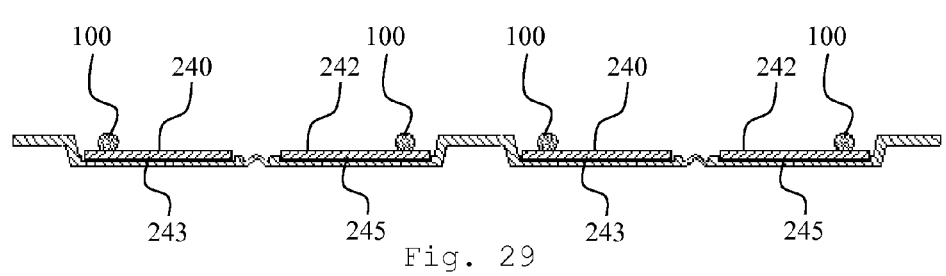
FIG. 29 is a cross-sectional view of an assembly employing the body shown in FIG. 28 having semiconductor dies attached thereto.
Figure 30:
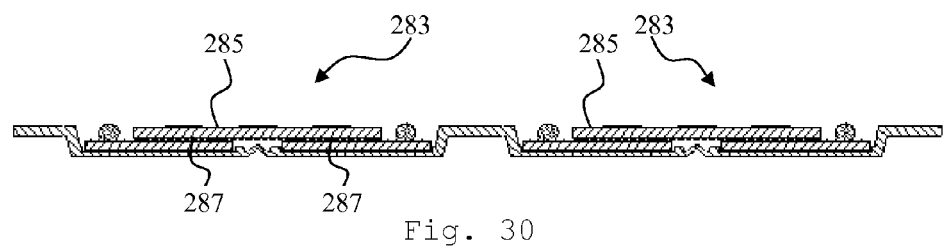
FIG. 30 is a cross-sectional view of the assembly shown in FIG. 29 having a plurality of dies stacks formed thereon.
Figure 31:
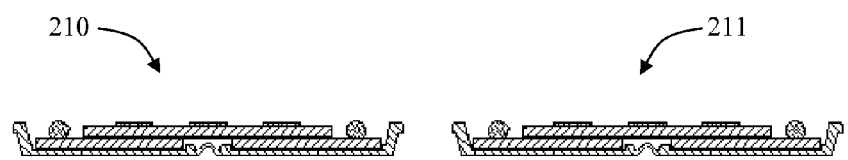
FIG. 31 is a cross-sectional view of the assembly shown in FIG. 30 being segmented to form a plurality of power semiconductor.

Referring to FIG. 11 fabrication of body 212 and semiconductor package 210 is discussed with respect to FIGS. 26-31, with the understanding that the same process may also be employed with appropriate alterations to fabricate bodies 12, 112, 312, 412, 512, shown in FIGS. 1, 8, 14, 16 and 22. Referring to FIGS. 26-31, a flat metal sheet 801, approximately 4 to 12 mils thick, is provided and then is subjected to a standard half-etch process to pattern the same with a plurality of protrusions 800, defining recessed regions as mounting regions 216 and 218, forming a flat patterned body 802 as shown in FIG. 27. Flat patterned body 802 is then stamped to define stress relief regions 214, walls 220, 222 and lead regions 274 and 276. Semiconductor dies 240 and 242 are adhered to mounting regions 216 and 218 employing adhesive layers 243 and 245. Following fixedly attaching semiconductor dies 240 and 242 to body 212, solder balls 100 are attached thereto. Following attachment of solder balls 100, a plurality of die stacks 283 are formed by attaching semiconductor die 285 to both semiconductor dies 240 and 242 using a layer 287 of adhesive. In this manner, multiple die packages 210 and 211 are formed concurrently. After formation of dies stack 283, segmentation of packages 210 and 211 occurs. Fabrication of body 412, shown in FIGS. 16 and 17, is performed using the aforedescribed process while omitting forming of half etch process to form a flat patterned body 802, shown in FIG. 27, and instead stamping the flat un-patterned body 801.

It should be understood that the foregoing description is merely an example of the invention and that modifications and may be made thereto without departing from the spirit and scope of the invention and should not be construed as limiting the scope of the invention. For example, the mounting regions may include multiple layers of material to provide desired electrical characteristics to the mounting surface. An electrically insulating layer may be deposited over the mounting surface with an electrical conductive layer being disposed over the electrically insulating layer. Semiconductor dies may then be fixedly attached to the electrically insulating layer, using known techniques. The scope of the invention, therefore, should be determined with respect to the appended claims, including the full scope of equivalents thereof.

The invention claimed is:

1. A method of forming a power semiconductor package from a body, said method comprising:
    forming, in said body, a stress relief region disposed between a pair of mounting regions;
    attaching a semiconductor die in each of said mounting regions, said semiconductor die having first and second sets of electrical contacts with said first set being on a first surface of said semiconductor die and said second set being disposed upon a second surface of said semiconductor die opposite to said first surface, with said first set being in electrical communication with said mounting region; and
    forming walls on outer sides of said pair of mounting regions, defining a shaped body, with said shaped body and walls defining an electrically conductive path that extends from said first set and terminates on a side of said package common with said second set.

2. The method as recited in claim 1 wherein forming a stress relief region and forming said walls further comprises providing a relatively flat body and stamping it into said shaped body.

3. The method as recited in claim 2 further comprising before stamping, half etching said flat body to form recessed portions for mounting regions.

4. The method as recited in claim 1 wherein said shaped body is made of metal.

5. The method as recited in claim 2 wherein stamping further includes providing features in a portion of said body to create a differential rigidity between said stress relief region and remaining portions of said body such that the remaining portions have a greater stiffness associated therewith than said stress relief regions.

6. The method as recited in claim 2 wherein stamping further includes forming a plurality of apertures in said stress relief region.

7. The method as recited in claim 2 wherein stamping further includes forming a bend in said stress relief region that extends along the length thereof.

8. The method as recited in claim 2 wherein stamping further includes forming a plurality of apertures in said stress relief region and a bend extending the length of said stress relief region.

9. The method as recited in claim 1 further including attaching solder balls to a side of said plurality of semiconductor dies facing away from said mounting regions.

10. The method as recited in claim 1 further comprising attaching a passive electrical element to said mounting regions.

11. The method as recited in claim 1 further including fixedly mounting to said second surface of said semiconductor die in each of said mounting regions, an additional die in superimposition with a portion of said second surface.

12. The method as recited in claim 11 wherein said semiconductor die is a field effect transistor (FET), and wherein said additional die comprises an integrated circuit (IC) control chip, said IC control chip being used to control said FET.

13. The method as recited in claim 12 further comprising attaching an inductor onto the said mounting regions.

14. The method as recited in claim 1 wherein forming walls further comprises forming walls such that the ends terminate coplanar to electrical connections from said second set of electrical contacts.

15. A semiconductor power package, comprising:
a shaped body having a stress relief region disposed between a pair of mounting regions and opposed walls, with each of said mounting regions extending from one of said opposed walls and terminating proximate to said stress relief region, and having a mounting surface, with each of said pair of opposed walls extending from said mounting surface and terminating in a lead portion, said lead portion extending transversely to said opposed walls, said stress relief region having a stiffness associated therewith that is less than the stiffness of the remaining portions of said body; and
a plurality of semiconductor dies, each of which is attached to one of said pair of mounting regions and in superimposition with said mounting surface and includes first and second sets of electrical contacts, with said first set being on a first surface of said semiconductor die and said second set being disposed upon a second surface of said semiconductor die opposite to said first surface, with said first set being in electrical communication with said mounting surface, said shaped body defining an electrically conductive path that extends from said first set and terminates on a side of said package common with said second set.

16. The package as recited in 15 wherein said shaped body is made of metal.

17. The package as recited in claim 15 wherein said stress relief region further includes a plurality of spaced-apart apertures formed in said body.

18. The package as recited in claim 15 wherein said stress relief region further includes a bend formed into said body along entire length of said stress relief region.

19. The package as recited in claim 15 wherein said stress relief region further includes a plurality of spaced-apart apertures formed in said body and a bend formed into said body along entire length of said stress relief region.

20. The package as recited in claim 15 wherein said lead portions of the walls are coplanar to electrical connections from said second set of electrical contacts.

21. The package as recited in claim 15 further including an additional semiconductor die attached to said plurality of semiconductor dies, with said additional semiconductor die having electrodes disposed upon a side thereof facing away from said plurality of semiconductor dies.

22. The package as recited in claim 21 wherein said additional semiconductor die is an integrated circuit (IC) control chip, and at least one of said plurality of semiconductor dies is a field effect transistor (FET).

23. The package as recited in claim 15 further including an additional semiconductor die attached to said plurality of semiconductor dies, with said additional semiconductor die having electrodes disposed upon a side thereof facing away from said plurality of semiconductor dies, with a portion of each of said plurality of semiconductor dies being in superimposition with said additional semiconductor die with a plurality of solder balls being attached to said plurality of semiconductor dies in areas thereof outside of said portion.

24. The package as recited in claim 15 further including an additional semiconductor die attached to plurality of semiconductor dies, defining a die stack, with said additional semiconductor die having electrodes disposed upon a side thereof facing away from said plurality of semiconductor dies, and a passive element mounted on said pair of mounting regions and disposed adjacent to said die stack.

25. The package as recited in claim 24 wherein said passive element is an inductor.

26. A metal body for a semiconductor power package comprising:
two planar central sections for semiconductor die attachment;
two wall portions extending down from opposite ends of the central section; and
a stress relief portion disposed between the planar central section parallel to said two wall portions, said stress relief portion being flexible in comparison to the planar central section.

27. The metal body of claim 26 wherein said walls form a cavity for a semiconductor die to be attached onto the central section and sized such that upon attaching a side of a semiconductor die to said central section, and opposing side aid of said semiconductor die would be electrically connected ends of said walls, with said ends lying in a common plane.

* * * * *